United States Patent
Choy

(10) Patent No.: US 9,478,712 B2
(45) Date of Patent: Oct. 25, 2016

(54) LIGHT EMITTING STRUCTURE AND MOUNT

(71) Applicant: KONINKLIJKE PHILIPS N.V., Eindhoven (NL)

(72) Inventor: Kwong Hin Henry Choy, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 14/764,202

(22) PCT Filed: Mar. 5, 2014

(86) PCT No.: PCT/IB2014/059466
§ 371 (c)(1),
(2) Date: Jul. 29, 2015

(87) PCT Pub. No.: WO2014/141009
PCT Pub. Date: Sep. 18, 2014

(65) Prior Publication Data
US 2015/0380610 A1    Dec. 31, 2015

Related U.S. Application Data

(60) Provisional application No. 61/798,858, filed on Mar. 15, 2013.

(51) Int. Cl.
*H01L 29/18* (2006.01)
*H01L 33/48* (2010.01)
*H01L 27/15* (2006.01)
*H01L 33/38* (2010.01)
*H01L 33/62* (2010.01)
*H01L 33/00* (2010.01)

(52) U.S. Cl.
CPC ............ *H01L 33/48* (2013.01); *H01L 27/156* (2013.01); *H01L 33/005* (2013.01); *H01L 33/38* (2013.01); *H01L 33/62* (2013.01); *H01L 2924/0002* (2013.01); *H01L 2933/0033* (2013.01); *H01L 2933/0066* (2013.01)

(58) Field of Classification Search
CPC ... H01L 33/48; H01L 27/156; H01L 33/005; H01L 33/38; H01L 33/62; H01L 2924/0002; H01L 2933/0033; H01L 2933/0066
See application file for complete search history.

(56) References Cited

U.S. PATENT DOCUMENTS

| | | | |
|---|---|---|---|
| 6,547,249 B2 | 4/2003 | Collins | |
| 8,760,068 B1 * | 6/2014 | Viviani | G09G 3/342 315/224 |
| 2008/0170396 A1 | 7/2008 | Yuan et al. | |
| 2008/0191222 A1 * | 8/2008 | Lee | H01L 27/153 257/91 |
| 2008/0211421 A1 * | 9/2008 | Lee | H05B 33/0806 315/250 |
| 2014/0228914 A1 * | 8/2014 | van de Ven | A61N 5/0618 607/88 |
| 2014/0361709 A1 * | 12/2014 | Krijn | H05B 33/0821 315/294 |

FOREIGN PATENT DOCUMENTS

EP    2442362 A1    4/2012
WO    2006095949 A1    9/2006

* cited by examiner

*Primary Examiner* — Fernando L Toledo
*Assistant Examiner* — Neil Prasad

(57) ABSTRACT

In a method according to embodiments of the invention, a light emitting structure comprising a plurality of light emitting diodes (LEDs) is provided. Each LED includes a p-contact and n-contact. A first mount and a second mount are provided. Each mount includes anode pads and cathode pads. The anode pads are aligned with the p-contacts and the cathode pads are aligned with the n-contacts. The method further includes mounting the light emitting structure on one of the first and second mounts. An electrical connection on the first mount between the plurality of LEDs differs from an electrical connection on the second mount between the plurality of LEDs. The first mount is operated at a different voltage than the second mount.

10 Claims, 5 Drawing Sheets

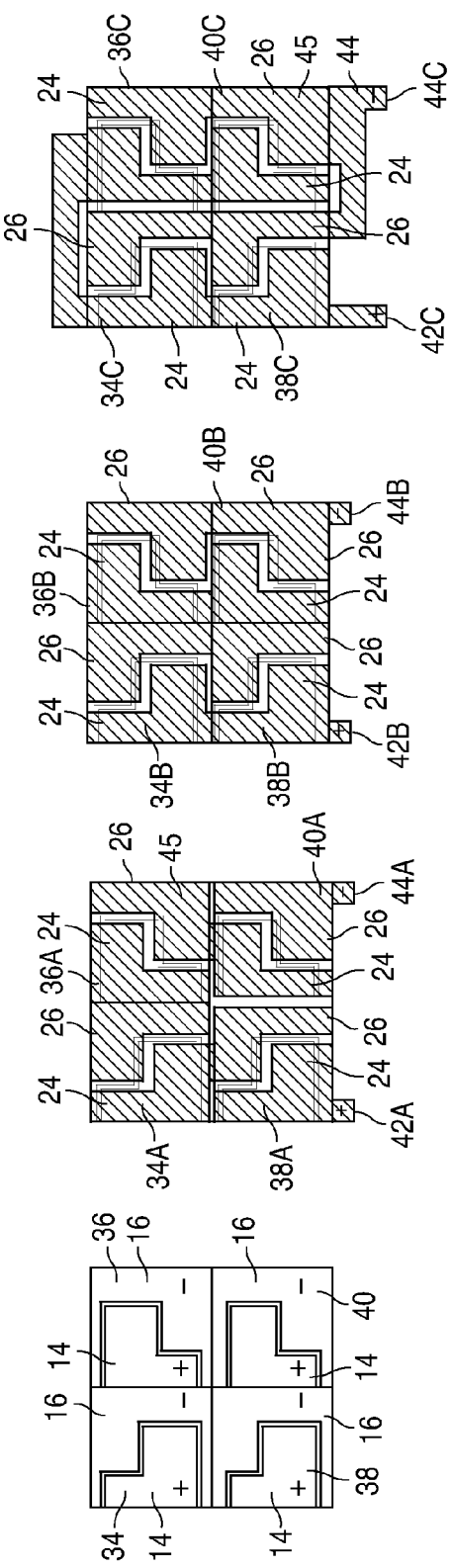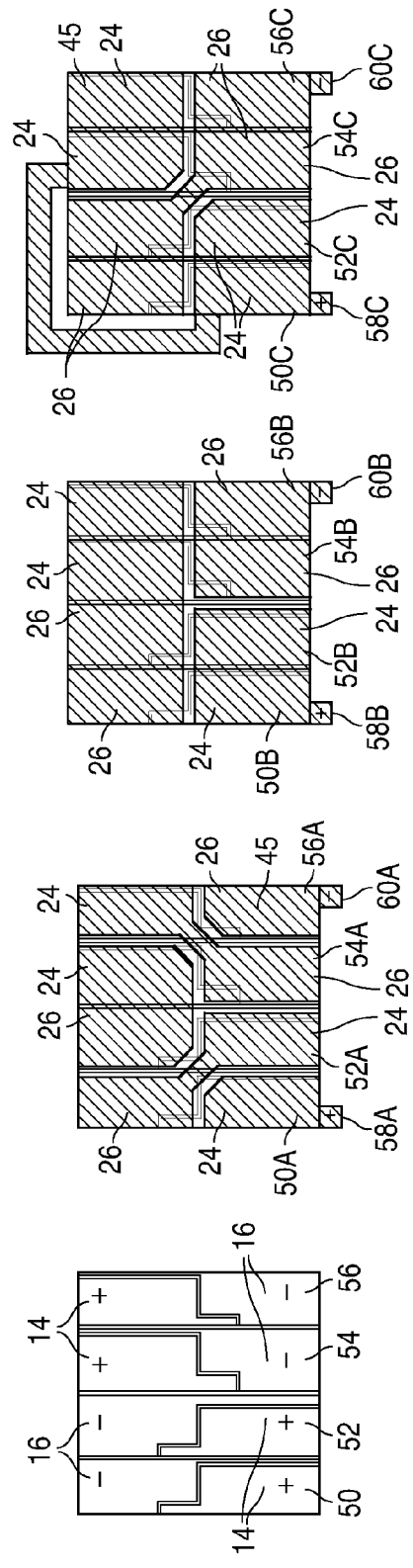

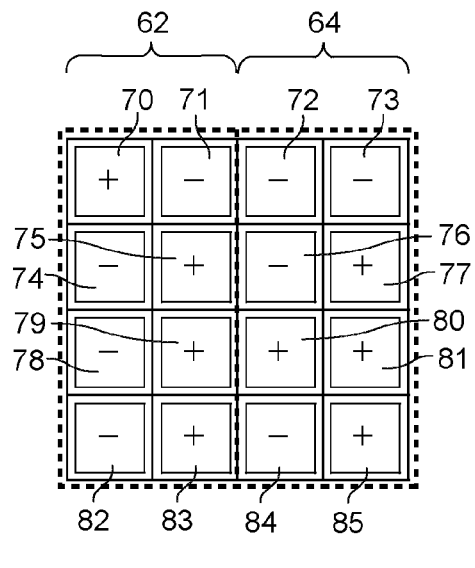
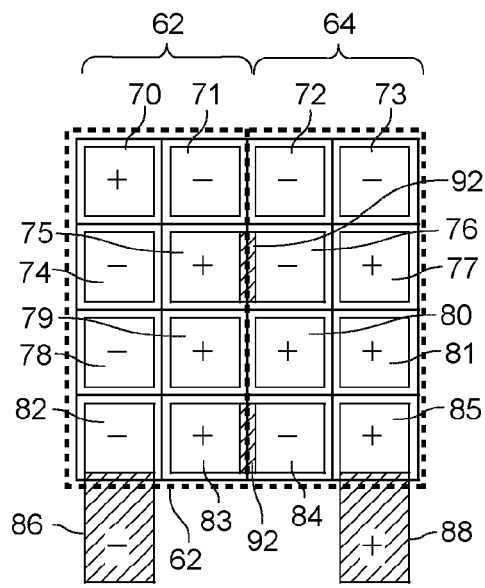
FIG. 12     FIG. 13
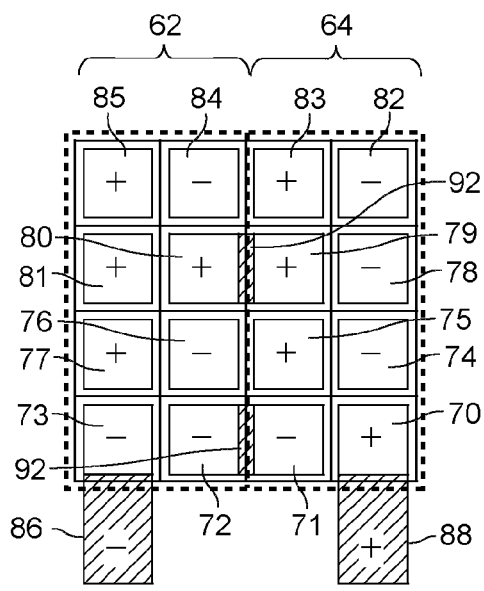
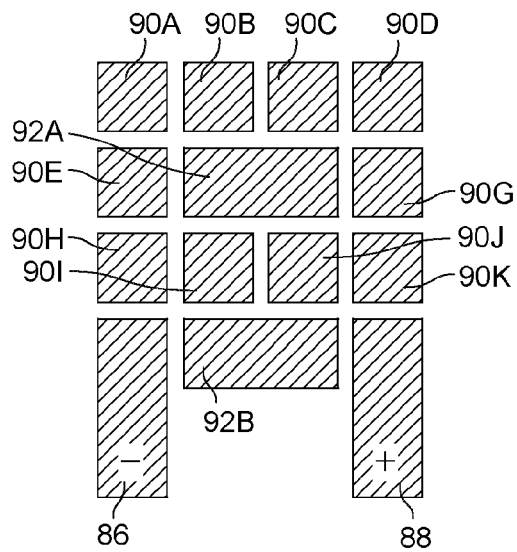
FIG. 14     FIG. 15

LIGHT EMITTING STRUCTURE AND MOUNT

CROSS-REFERENCE TO PRIOR APPLICATIONS

This application is the U.S. National Phase application under 35 U.S.C. §371 of International Application No. PCT/IB2014/059466, filed on Mar. 5, 2014, which claims the benefit of U.S. Patent Application No. 61/798,858, filed on Mar. 15, 2013. These applications are hereby incorporated by reference herein.

FIELD OF THE INVENTION

The present invention relates to a light emitting structure that may be mounted on different mounts, or on a single mount in different orientations, in order to operate the light emitting structure at different voltages.

BACKGROUND

Semiconductor light-emitting devices including light emitting diodes (LEDs), resonant cavity light emitting diodes (RCLEDs), vertical cavity laser diodes (VCSELs), and edge emitting lasers are among the most efficient light sources currently available. Materials systems currently of interest in the manufacture of high-brightness light emitting devices capable of operation across the visible spectrum include Group III-V semiconductors, particularly binary, ternary, and quaternary alloys of gallium, aluminum, indium, and nitrogen, also referred to as III-nitride materials. Typically, III-nitride light emitting devices are fabricated by epitaxially growing a stack of semiconductor layers of different compositions and dopant concentrations on a sapphire, silicon carbide, III-nitride, or other suitable substrate by metal-organic chemical vapor deposition (MOCVD), molecular beam epitaxy (MBE), or other epitaxial techniques. The stack often includes one or more n-type layers doped with, for example, Si, formed over the substrate, one or more light emitting layers in an active region formed over the n-type layer or layers, and one or more p-type layers doped with, for example, Mg, formed over the active region. Electrical contacts are formed on the n- and p-type regions.

U.S. Pat. No. 6,547,249 teaches in the abstract "Series or parallel LED arrays are formed on a highly resistive substrate, such that both the p- and n-contacts for the array are on the same side of the array. The individual LEDs are electrically isolated from each other by trenches or by ion implantation. Interconnects deposited on the array connects the contacts of the individual LEDs in the array. In some embodiments, the LEDs are III-nitride devices formed on sapphire substrates . . . . In one embodiment, multiple LEDs formed on a single substrate are connected in series. In one embodiment, multiple LEDs formed on a single substrate are connected in parallel."

SUMMARY

It is an object of the invention to provide a plurality of different mounts, or a single mount that can be arranged in a plurality of different orientations on which a single light emitting structure may be mounted in order to operate the light emitting structure at different voltages.

In a method according to embodiments of the invention, a light emitting structure comprising a plurality of light emitting diodes (LEDs) is provided. Each LED includes a p-contact and an n-contact. A first mount and a second mount are provided. Each mount includes anode pads and cathode pads. At least one of the anode pads is aligned with a p-contact and at least one of the cathode pads is aligned with an n-contact. The method further includes mounting the light emitting structure on one of the first and second mounts. An electrical connection on the first mount between the plurality of LEDs differs from an electrical connection on the second mount between the plurality of LEDs. The first mount is operated at a different voltage than the second mount.

Embodiments of the invention include a light emitting structure including a plurality of light emitting diodes (LEDs). Each LED has a light emitting layer disposed between an n-type region and a p-type region, a p-contact disposed on the p-type region, and an n-contact disposed on the n-type region. The light emitting structure is attached to a mount. The n-contacts and p-contacts are attached to the mount in one of a first orientation and a second orientation. The first orientation is operated at a different voltage than the second orientation.

BRIEF DESCRIPTION OF THE DRAWINGS

FIG. 4 is a plan view of a light emitting structure including four LEDs.

FIGS. 5, 6, and 7 are plan views of mounts on which the light emitting structure of FIG. 4 may be mounted. Each of the mounts illustrated in FIGS. 5, 6, and 7 may be operated at a different voltage.

FIG. 8 is a plan view of a light emitting structure including four LEDs.

FIGS. 9, 10, and 11 are plan views of mounts on which the light emitting structure of FIG. 8 may be mounted. Each of the mounts illustrated in FIGS. 9, 10, and 11 may be operated at a different voltage.

FIG. 12 is a plan view of light emitting structure including two LEDs.

FIGS. 13 and 14 illustrate two different orientations with which the light emitting structure of FIG. 12 may be mounted on the mount of FIG. 15. Each of the orientations illustrated in FIGS. 13 and 14 may be operated at a different voltage.

FIG. 15 is a plan view of a mount for the light emitting structure illustrated in FIG. 12.

DETAILED DESCRIPTION

In embodiments of the invention, a single light emitting structure including multiple semiconductor light emitting devices can be attached to multiple mounts, or a single mount that can be used in different orientations. Different mounts, or the different orientations of a single mount, may be operated at different voltages.

Though in the examples below the semiconductor light emitting devices are III-nitride LEDs that emit blue or UV light, semiconductor light emitting devices besides LEDs such as laser diodes and semiconductor light emitting devices made from other materials systems such as other III-V materials, III-phosphide, III-arsenide, II-VI materials, ZnO, or Si-based materials may be used.

Figure 1:
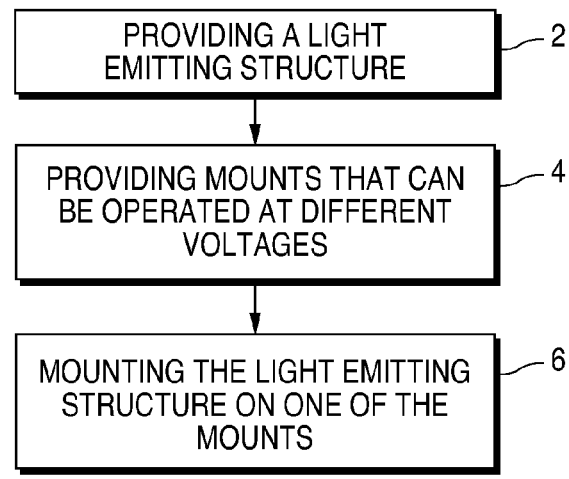
FIG. 1 illustrates a method according to embodiments of the invention.
Figure 2:
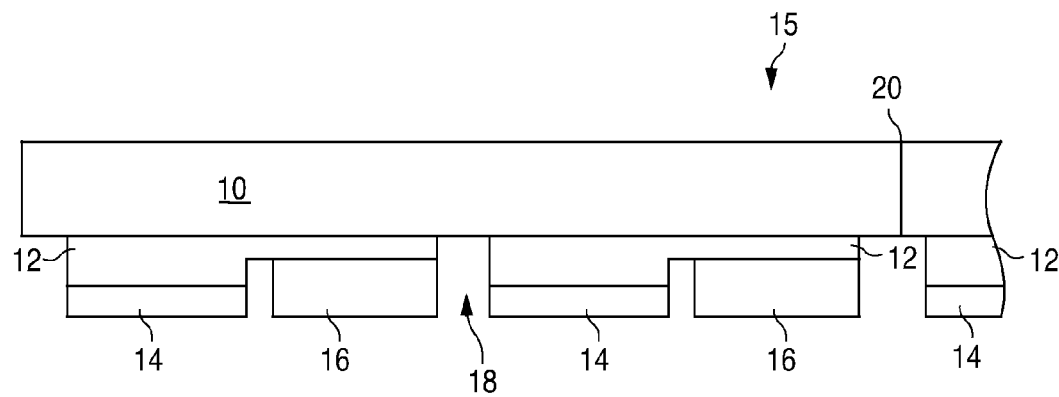
FIG. 2 is a cross sectional view of a light emitting structure including multiple light emitting diodes.

FIG. 1 illustrates a method according to embodiments of the invention. In block 2, a light emitting structure is provided. The light emitting structure includes multiple light emitting devices, such as multiple LEDs. FIG. 2 is a cross sectional view of one example of a light emitting structure, described below. FIGS. 4 and 8 are plan views of examples of light emitting structures, described below.

Figure 3:
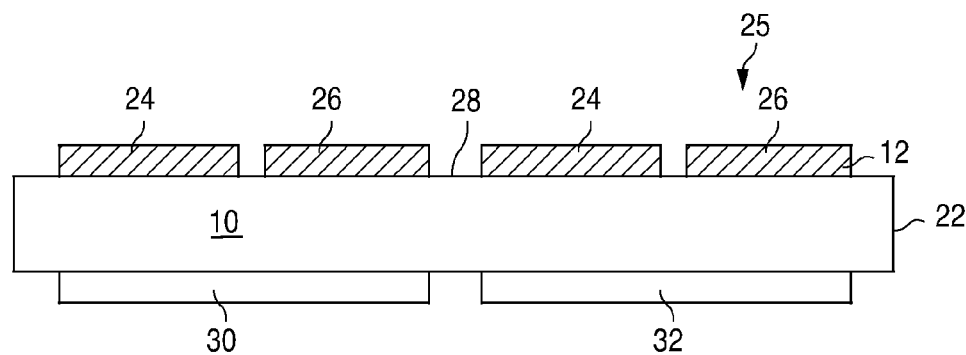
FIG. 3 is a cross sectional view of a mount on which the light emitting structure of FIG. 2 may be mounted.

In block 4, a first mount and a second mount are provided. The light emitting structure described in block 2 can be mounted on either mount or on both mounts. Each mount has anode pads and cathode pads which align with the p-contacts and the n-contacts of the light emitting structure. FIG. 3 is a cross sectional view of a mount on which the light emitting structure illustrated in FIG. 2 may be mounted. FIGS. 5, 6, and 7, described below, are plan views of mounts that may be used with the light emitting structure of FIG. 4. FIGS. 9, 10, and 11, described below, are plan views of mounts that may be used with the light emitting structure of FIG. 8. The LEDs are connected differently on the first mount and the second mount. Accordingly, the first mount and the second mount may be operated at different voltages.

In block 6, the light emitting structure is mounted on one of the first and second mounts.

Though the examples below show a light emitting structure with four LEDs, more or fewer LEDs may be used, and the LEDs may be arranged in any suitable configuration other than the 2×2 array or the linear array illustrated.

FIG. 2 is a cross sectional view of an example of a light emitting structure 15. In the light emitting structure 15 of FIG. 2, one or more III-nitride semiconductor device structures 12 are grown on a growth substrate 10, as is known in the art. The growth substrate 10 may be any suitable substrate such as, for example, sapphire, SiC, Si, GaN, or a composite substrate. Each semiconductor structure 12 includes a light emitting or active region sandwiched between n- and p-type regions. An n-type region may be grown first and may include multiple layers of different compositions and dopant concentration including, for example, preparation layers such as buffer layers or nucleation layers, and/or layers designed to facilitate removal of the growth substrate, which may be n-type or not intentionally doped, and n- or even p-type device layers designed for particular optical, material, or electrical properties desirable for the light emitting region to efficiently emit light. A light emitting or active region is grown over the n-type region. Examples of suitable light emitting regions include a single thick or thin light emitting layer, or a multiple quantum well light emitting region including multiple thin or thick light emitting layers separated by barrier layers. A p-type region may then be grown over the light emitting region. Like the n-type region, the p-type region may include multiple layers of different composition, thickness, and dopant concentration, including layers that are not intentionally doped, or n-type layers.

After growth, each semiconductor structure 12 may be patterned in one or more etching steps. For example, a metal p-contact structure 14 may be formed on the p-type layer, then for each LED, portions of the p-contact 14, the p-type region, and the active region in each semiconductor structure 12 are removed to expose a portion of the n-type region on which a metal n-contact structure 16 is formed. In the same or a separate etching step, in the areas 18 between semiconductor structures 12, any semiconductor material may be etched to reveal an insulating growth substrate 10, or to reveal an insulating layer, such as an undoped III-nitride layer grown prior to forming the n-type region of each semiconductor structure 12. Groups of devices may be formed by cutting the growth substrate at the desired location 20. In some embodiments, the individual LEDs are removed from growth substrate 10 and attached to a suitable host. Any suitable device may be used and the invention is not limited to the device illustrated in cross section in FIG. 2.

FIG. 3 is a cross sectional view of a mount 25 on which the light emitting structure of FIG. 2 may be mounted. The mount 25 illustrated in FIG. 3 includes a body 22. Body 22 is often an insulating material such as ceramic, glass, or silicon. In the alternative body 22 may be conductive. In a mount 25 with a conductive body, one or more insulating layers must be formed to electrically isolate anode and cathode pads formed on the body 22. For each device, anode pads 24 and cathode pads 26 are formed on one side of body 22. Anode pads 24 connect to the corresponding p-contacts 14 on the light emitting structure 15 of FIG. 2. Cathode pads 26 connect to the corresponding n-contacts 16 on the light emitting structure 15 of FIG. 2. Several sets of pads 24 and 26 may be formed on mount 25 so that the number of pad sets corresponds to the number of light emitting semiconductor structures 12 on light emitting structure 15. One or more pads 30 and 32 may be formed on the other side of body 22, for electrical and physical connection to another structure such as a PC board. Pads 30 and 32 may be electrically connected to anode pads 24 and cathode pads 26 by vias formed on or within body 22 (not shown in FIG. 3).

Though in the mounts described below, the operating voltages described for the mounts assume that the individual LEDs attached to the mount are operated at a forward bias voltage of 3V, other operating voltages for the mounts may be used if one or more of the LEDs are operated at a forward bias voltage other than 3V.

FIG. 4 illustrates a light emitting structure including four LEDs 34, 36, 38, and 40 arranged in a 2×2 array. The view of FIG. 4 illustrates the arrangement of n-contacts 16 and p-contacts 14 as the light emitting structure is attached to the mounts illustrated in FIGS. 5, 6, and 7. According, FIG. 4 is a plan view of the n-contacts and p-contacts of FIG. 2 as they would appear if viewed from the top of substrate 10 through the LEDs. Each LED includes a p-contact 14 and an n-contact 16. FIGS. 5, 6, and 7 illustrate mounts that may be used with the light emitting structure illustrated in FIG. 4. Each mount includes large metal regions, which are indicated on each of FIGS. 5, 6, and 7 by hatching. Portions of the large metal regions serve as anode pads 24 and cathode pads 26 which connect to the p-contacts 14 and n-contacts 16 on each of LEDs 34, 36, 38, and 40. LED 34 may be attached to the mounts illustrated in FIGS. 5, 6, and 7 at positions 34A, 34B, and 34C on the respective mounts; LED 36 may be attached to the mounts illustrated in FIGS. 5, 6, and 7 at positions 36A, 36B, and 36C on the respective mounts, and so forth. Structures such as solder and stud bumps may be used to attach the LEDs to the mount. Any suitable attach method may be used, including for example solder attach and eutectic attach.

In the mount illustrated in FIG. 5, anode pad 24 of LED position 38A is connected to an anode contact pad 42A on the mount. Cathode pad 26 of LED position 38A is connected to anode pad 24 of LED position 34A. Cathode pad 26 of LED position 34A is connected to anode pad 24 of LED position 36A. Cathode pad 26 of LED position 36A is connected to anode pad 24 of LED position 40A. Cathode pad 26 of LED position 40A is connected to a cathode contact pad 44A on the mount. Accordingly, LEDs 38, 34, 36, and 40 are connected in series when attached to the mount illustrated in FIG. 5. The structure including the light emitting structure of FIG. 4 and the mount of FIG. 5 may be operated at 12 V for individual LEDs operated at a forward bias voltage of 3 V.

In the mount illustrated in FIG. 6, anode pad 24 of LED position 38B is connected to an anode contact pad 42B on the mount. The anode pads 24 of LED positions 34B and 38B are connected. The cathode pads 26 of LED positions 34B and 38B are connected. Cathode pad 26 of LED position 34B is connected to anode pad 24 of LED position 36B. The anode pads 24 of LED positions 36B and 40B are connected. The cathode pads 26 of LED positions 36B and 40B are connected. Cathode pad 26 of LED position 40B is connected to a cathode contact pad 44B on the mount. Accordingly, LEDs 38 and 34 are connected in parallel and LEDs 36 and 40 are connected in parallel. The two groups of parallel connected LEDs are connected in series when attached to the mount illustrated in FIG. 6. The structure including the light emitting structure of FIG. 4 and the mount of FIG. 6 may be operated at 6 V for individual LEDs operated at a forward bias voltage of 3 V.

In the mount illustrated in FIG. 7, the anode pads 24 of LED positions 34C, 36C, 38C, and 40C are connected to each other and to anode contact pad 42C. The cathode pads 26 of LED positions 34C, 36C, 38C, and 40C are connected to each other and to cathode contact pad 44C. Accordingly, LEDs 34, 36, 38, and 40 are all connected in parallel when attached to the mount illustrated in FIG. 7. The structure including the light emitting structure of FIG. 4 and the mount of FIG. 7 may be operated at 3 V for individual LEDs operated at a forward bias voltage of 3 V.

FIG. 8 is a plan view of a light emitting structure including four LEDs 50, 52, 54, and 56 arranged in a linear array. Each LED includes a p-contact 14 and an n-contact 16. The view of FIG. 8 illustrates the arrangement of n-contacts 16 and p-contacts 14 as the light emitting structure is attached to the mounts illustrated in FIGS. 9, 10, and 11. FIGS. 9, 10, and 11 illustrate mounts that may be used with the light emitting structure illustrated in FIG. 8. Each mount includes anode pads 24 and cathode pads 26 which connect to the p-contacts 14 and n-contacts 16 on each of LEDs 50, 52, 54, and 56. LED 50 is attached to the mounts illustrated in FIGS. 9, 10, and 11 at positions 50A, 50B, and 50C on the respective mounts; LED 52 is attached to the mounts illustrated in FIGS. 9, 10, and 11 at positions 52A, 52B, and 52C on the respective mounts, and so forth. Structures such as solder and stud bumps may be used to attach the LEDs to the mount. Any suitable attach method may be used, including for example solder attach and eutectic attach.

In the mount illustrated in FIG. 9, anode pad 24 of LED position 50A is connected to an anode contact pad 58A on the mount. Cathode pad 26 of LED position 50A is connected to anode pad 24 of LED position 52A. Cathode pad 26 of LED position 52A is connected to anode pad 24 of LED position 54A. Cathode pad 26 of LED position 54A is connected to anode pad 24 of LED position 56A. Cathode pad 26 of LED position 56A is connected to a cathode contact pad 60A on the mount. Accordingly, LEDs 50, 52, 54, and 56 are connected in series when attached to the mount illustrated in FIG. 9. The structure including the light emitting structure of FIG. 8 and the mount of FIG. 9 may be operated at 12 V for individual LEDs operated at a forward bias voltage of 3 V.

In the mount illustrated in FIG. 10, anode pad 24 of LED position 50B is connected to an anode contact pad 58B on the mount. The anode pads 24 of LED positions 50B and 52B are connected. Cathode pads 26 of LED positions 50B and 52B are connected. Cathode pad 26 of LED position 52B is connected to anode pad 24 of LED position 54B. The anode pads 24 of LED positions 54B and 56B are connected. The cathode pads 26 of LED positions 54B and 56B are connected. Cathode pad 26 of LED position 56B is connected to a cathode contact pad 60B on the mount. Accordingly, LEDs 50 and 52 are connected in parallel and LEDs 54 and 56 are connected in parallel. The two groups of parallel-connected LEDs are connected in series when attached to the mount illustrated in FIG. 10. The structure including the light emitting structure of FIG. 8 and the mount of FIG. 10 may be operated at 6 V for individual LEDs operated at a forward bias voltage of 3 V.

In the mount illustrated in FIG. 11, the anode pads 24 of LED positions 50C, 52C, 54C, and 56C are connected to each other and to anode contact pad 58C. The cathode pads 26 of LED positions 50C, 52C, 54C, and 56C are connected to each other and to cathode contact pad 60C. Accordingly, LEDs 50, 52, 54, and 56 are all connected in parallel when attached to the mount illustrated in FIG. 11. The structure including the light emitting structure of FIG. 8 and the mount of FIG. 11 may be operated at 3 V for individual LEDs operated at a forward bias voltage of 3 V.

In some embodiments, the contacts on the light emitting structure and the anode and cathode pads on the mount are arranged such that a different operating voltage are achieved with a single light emitting structure design and a single mount design, by attaching the light emitting structure on the mount with different orientations, as illustrated in FIGS. 12, 13, 14, and 15. FIG. 12 illustrates the arrangement of contacts on a light emitting structure including two LEDs. FIG. 15 is a plan view of a mount on which the light emitting structure of FIG. 12 may be mounted. FIGS. 13 and 14 illustrate two different orientations with which the light emitting structure of FIG. 12 may be mounted on the mount of FIG. 15. The two orientations may be operated at different voltages.

The light emitting structure illustrated in FIG. 12 includes two LEDs 62 and 64. The discussion below assumes each LED 62 and 64 is operated at a forward bias voltage of 3 V. Each LED includes 8 contact regions. LED 62 includes p-contact regions 70, 75, 79, and 83 and n-contact regions 71, 74, 78, and 82. P-contact regions 70, 75, 79, and 83 are electrically connected to each other. N-contact regions 71, 74, 78, and 82 are electrically connected to each other. LED 64 includes p-contact regions 77, 80, 81, and 85 and n-contact regions 72, 73, 76, and 84. P-contact regions 77, 80, 81, and 85 are electrically connected to each other. N-contact regions 72, 73, 76, and 84 are electrically connected to each other. The contact regions of a given polarity on a single LED may be electrically connected to each other for example by a metal dielectric stack. The redistribution of contacts via one or more metal and dielectric layers is known in the art. LEDs 62 and 64 are electrically isolated from each other.

FIG. 15 illustrates an arrangement of metal pads on a mount that may be used with the light emitting structure illustrated in FIG. 12. The metal pads may be formed on, for example, an insulating body, as described above. Ten metal pads 90A-90J and portions of a cathode contact pad 86 and an anode contact pad 88 align with the 16 n- and p-contact regions 70-85 on the two LEDs 62 and 64 illustrated in FIG. 12. Two of the metal pads 92A and 92B provide electrical connection between the two LEDs 62 and 64.

FIG. 13 illustrates an orientation with which the light emitting structure illustrated in FIG. 12 may be attached to the mount illustrated in FIG. 15. The orientation illustrated in FIG. 13 may be operated at 6 V. FIG. 14 illustrates an orientation with which the light emitting structure illustrated in FIG. 12 may be attached to the mount illustrated in FIG. 15. The orientation illustrated in FIG. 14 may be operated at 3 V. The light emitting structure in FIG. 14 is rotated 180° relative to the orientation illustrated in FIG. 13.

In the 6 V structure illustrated in FIG. 13, the p-contact pad 75 of LED 62 and the n-contact pad 76 of LED 64 are attached to metal pad 92A, and the p-contact pad 83 of LED 62 and the n-contact pad 84 of LED 64 are attached to metal pad 92B. Accordingly, metal pads 92 electrically connect the p-contacts of LED 62 to the n-contacts of LED 64 such that the two LEDs are connected in series.

In the 3 V structure illustrated in FIG. 14, the p-contact pad 80 of LED 64 and the p-contact pad 79 of LED 62 are attached to metal pad 92A, and the n-contact pad 72 of LED 64 and the n-contact pad 71 of LED 62 are attached to metal pad 92B. Accordingly, metal pads 92 electrically connect the p-contacts of LEDs 62 and 64 and electrically connect the n-contacts of LEDs 62 and 64 such that the two LEDs are connected in parallel.

Figure 17:
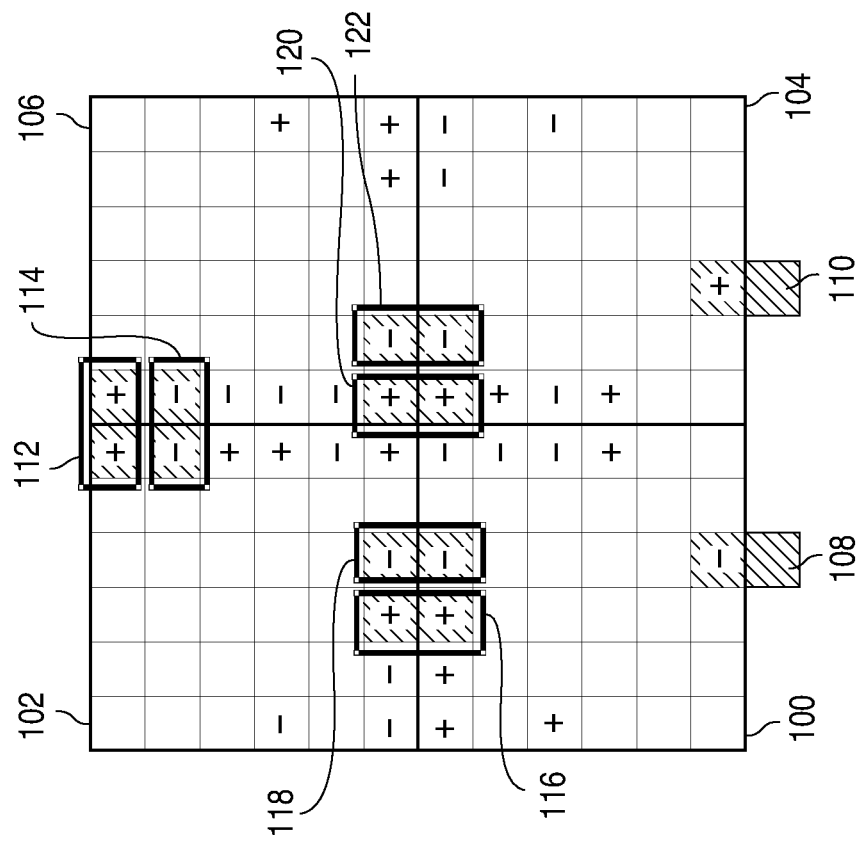
FIGS. 16, 17, and 18 illustrate three different orientations with which a light emitting structure with a 2×2 array of LEDs may be attached to a mount. Each of the orientations illustrated in FIGS. 16, 17, and 18 may be operated at a different voltage.
Figure 16:
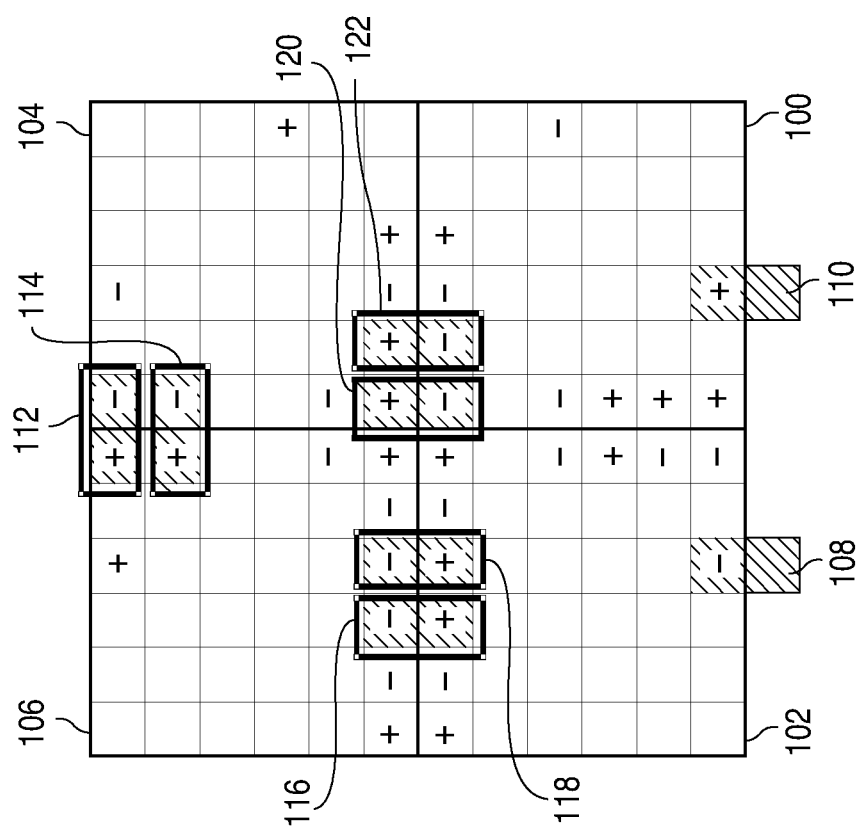
Figure 18:
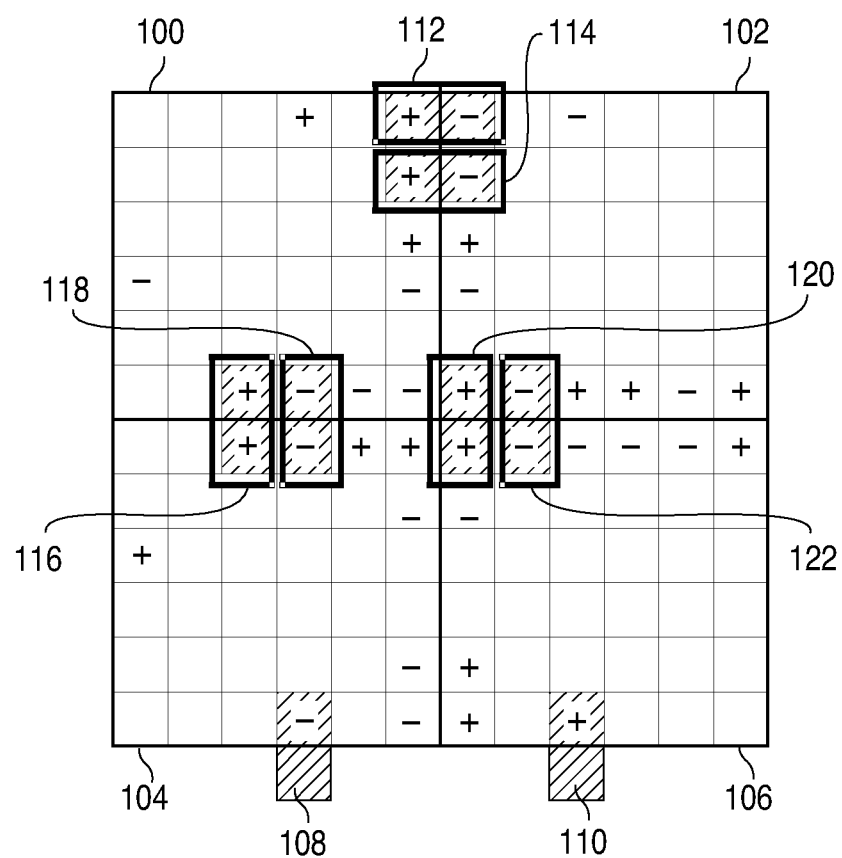

The concepts illustrated in FIGS. 12-15—distributing the n- and p-contacts on each LED across different regions, and forming a mount that provides different electrical connections between the LEDs based on the orientation—may be extended to light emitting structures with more than two LEDs. FIGS. 16, 17, and 18 illustrate light emitting structures with four LEDs with distributed n- and p-contacts attached to a single mount with three different orientations. Four LEDs 100, 102, 104, and 106 are represented by four large squares in a 2×2 array. Each LED has 36 contact regions. Both the p- and n-contact regions in FIGS. 16, 17, and 18 are represented by small squares. P-contact regions are indicated by plus signs and n-contact regions are indicated by minus signs. Unspecified contact regions may be either p- or n-contact regions. As in FIG. 12, on a single LED, all p-contact regions are electrically connected to each other and all n-contact regions are electrically connected to each other. The discussion below assumes each LED is operated at a forward bias voltage of 3 V, though in any of the embodiments described herein LEDs with a different forward bias voltage may be used.

As in the mount illustrated in FIG. 15, the mount illustrated in FIGS. 16, 17, and 18 includes multiple metal pads that align with p- and n-contact regions on the individual LEDs 100, 102, 104, and 106. In the mount illustrated in FIGS. 16, 17, and 18, electrical connection between the LEDs 100, 102, 104, and 106 is provided by metal pads that span two contact regions at six locations 112, 114, 116, 118, 120, and 122. The mount includes a cathode contact pad 108 and an anode contact pad 110.

FIG. 16 illustrates an orientation that may be operated at 12 V. In FIG. 16, at metal pads 116 and 118, n-contact regions of LED 106 are connected to p-contact regions of LED 102, such that LEDs 106 and 102 are connected in series. At metal pads 112 and 114, n-contact regions of LED 104 are connected to p-contact regions of LED 106, such that LEDs 104 and 106 are connected in series. At metal pads 120 and 122, n-contact regions of LED 100 are connected to p-contact regions of LED 104, such that LEDs 100 and 104 are connected in series. Accordingly, all four LEDs 100, 102, 104, and 106 are connected in series in the orientation illustrated in FIG. 16.

FIG. 17 illustrates an orientation that may be operated at 3 V. In the orientation illustrated in FIG. 17, the light emitting structure is rotated 90° relative to the orientation illustrated in FIG. 16. At metal pad 116 p-contact regions on LEDs 102 and 100 are connected. At metal pad 118, n-contact regions on LEDs 102 and 100 are connected. LEDs 102 and 100 are therefore connected in parallel. At metal pad 112, p-contact regions on LEDs 102 and 106 are connected. At metal pad 114, n-contact regions on LEDs 102 and 106 are connected. LEDs 102 and 106 are connected in parallel. At metal pad 120, p-contact regions on LEDs 106 and 104 are connected. At metal pad 122, n-contact regions on LEDs 106 and 104 are connected. LEDs 106 and 104 are connected in parallel. Accordingly, all four LEDs 100, 102, 104, and 106 are connected in parallel in the orientation illustrated in FIG. 17.

FIG. 18 illustrates an orientation that may be operated at 6 V. In the orientation illustrated in FIG. 18, the light emitting structure is rotated 90° relative to the orientation illustrated in FIG. 17. At metal pad 116 p-contact regions on LEDs 100 and 104 are connected. At metal pad 118, n-contact regions on LEDs 100 and 104 are connected. LEDs 100 and 104 are therefore connected in parallel. At metal pads 112 and 114, n-contact regions on LED 102 are connected to p-contact regions on LED 100. LEDs 102 and 100 are therefore connected in series. At metal pad 120, p-contact regions on LEDs 102 and 106 are connected. At metal pad 122, n-contact regions on LEDs 102 and 106 are connected. LEDs 102 and 106 are therefore connected in parallel. Accordingly, LEDs 106 and 102 are connected in parallel and LEDs 104 and 100 are connected in parallel. The two groups of parallel-connected LEDs are connected in series in the orientation illustrated in FIG. 18.

Having described the invention in detail, those skilled in the art will appreciate that, given the present disclosure, modifications may be made to the invention without departing from the spirit of the inventive concept described herein. Therefore, it is not intended that the scope of the invention be limited to the specific embodiments illustrated and described.

The invention claimed is:
1. A method comprising:
providing a first light emitting structure and a second light emitting structure, each light-emitting structure comprising a plurality of LEDs on a substrate, each LED comprising a p-contact and an n-contact, the first and the second light emitting structures having a same p- and n-contact pattern;
providing a first mount and a second mount, each mount comprising anode pads and cathode pads, the first and the second mounts having different anode and cathode pad patterns that interconnect the plurality of LEDs of the first and the second light emitting structures in different manners;
mounting the first light emitting structure on the first mount; and
mounting the second light emitting structure on the second mount,
wherein an electrical connection on the first mount between the plurality of LEDs of the first light emitting structure differs from an electrical connection on the second mount between the plurality of LEDs of the second light emitting structure, wherein the first mount is operated at a different voltage than the second mount.

2. The method of claim 1 wherein the electrical connection on the first mount comprises a series connection between two of the plurality of LEDs of the first light emitting structure and the electrical connection on the second mount comprises a parallel connection between two of the plurality of LEDs of the second light emitting structure.

3. The method of claim 1,
wherein each light emitting structure comprises four LEDs,
wherein the electrical connection on the first mount comprises a series connection among all four LEDs of the first light emitting structure,
wherein the electrical connection on the second mount comprises a parallel connection among all four LEDs of the second light emitting structure,
wherein the first mount is operated at a higher voltage than the second mount.

4. The method of claim 1
wherein each light emitting structure comprises four LEDs;
wherein the electrical connection on the first mount comprises a series connection between first and second LEDs of the first light emitting structure, a first parallel connection between the first LED and a third LED of the first light emitting structure, and a second parallel connection between the second LED and a fourth LED of the first light emitting structure,
wherein the electrical connection on the second mount comprises a parallel connection among all four LEDs of the second light emitting structure,
wherein the first mount is operated at a higher voltage than the second mount.

5. A device comprising:
a light emitting structure, the light emitting structure comprising:
a plurality of LEDs, each LED comprising:
a light emitting layer disposed between an n-type region and a p-type region;
a p-contact disposed on the p-type region; and
an n-contact disposed on the n-type region; and
a mount comprising an area of anode and cathode pads,
wherein the light emitting structure is attached to the mount,
wherein direct current electricity is supplied to at least two terminals on the mount,
wherein the n-contacts and the p-contacts are attached to the mount in one of a first orientation over the area of the anode and cathode pads and a second orientation over the area of the anode and cathode pads, the second orientation being rotated relative to the first orientation,
wherein the power supplied to the first orientation is operated at a different voltage than the second orientation.

6. The device of claim 5 wherein in the first orientation, the light emitting structure is rotated 90° relative to the second orientation.

7. The device of claim 5 wherein in the first orientation, the light emitting structure is rotated 180° relative to the second orientation.

8. A device comprising:
a light emitting structure, the light emitting structure comprising:
a plurality of LEDs, each LED comprising:
a light emitting layer disposed between an n-type region and a p-type region;
a p-contact disposed on the p-type region; and
an n-contact disposed on the n-type region; and
a mount,
wherein the light emitting structure is attached to the mount,
wherein direct current electricity is supplied to at least two terminals on the mount,
wherein the n-contacts and the p-contacts are attached to the mount in one of a first orientation and a second orientation at least rotated from the first orientation,
wherein the power supplied to the first orientation is operated at a different voltage than the second orientation,
wherein for each LED, the n-contact is divided into a plurality of first regions electrically connected to each other and the p-contact is divided into a plurality of second regions electrically connected to each other.

9. The device of claim 8,
wherein the mount comprises third regions disposed on the top surface of an insulating body,
wherein the third regions align with the first and second regions,
wherein the first regions and second regions align with different third regions in the first and second orientations.

10. The device of claim 5
wherein in the first orientation, at least two of the LEDs in the plurality of LEDs are connected in series,
wherein in the second orientation, at least two of the LEDs in the plurality of LEDs are connected in parallel.

* * * * *